United States Patent

Weiner

[11] Patent Number: 6,049,616
[45] Date of Patent: Apr. 11, 2000

[54] DYNAMIC RANGE RESTORER AND METHOD

[76] Inventor: Keith Weiner, 1301 N. Jackson St., Chandler, Ariz. 85225

[21] Appl. No.: 08/877,301

[22] Filed: Jun. 17, 1997

[51] Int. Cl.[7] .................................................. H03G 7/00
[52] U.S. Cl. ........................................... 381/106; 381/118
[58] Field of Search ..................................... 381/106, 94.5, 381/104, 107, 108, 120, 121, 118, 61; 333/14; 84/741

[56] References Cited

U.S. PATENT DOCUMENTS

| | | |
|---|---|---|
| 3,602,824 | 8/1971 | Rusch . |
| 4,169,219 | 9/1979 | Beard . |
| 4,202,238 | 5/1980 | Moog . |
| 4,881,047 | 11/1989 | Wallter, Jr. . |
| 5,389,730 | 2/1995 | Wachi . |
| 5,394,474 | 2/1995 | Hirai et al. . |

Primary Examiner—Vivian Chang
Attorney, Agent, or Firm—Parsons & Goltry; Robert A. Parsons; Michael W. Goltry

[57] ABSTRACT

A method and an apparatus for restoration of dynamic range to electronically amplified acoustic signals. The apparatus includes in combination: (i) a first input for accepting electrical input signals; (ii) a first output for supplying the electrical input signals to a signal conditioning apparatus; (iii) a second input for accepting conditioned electrical input signals from the signal conditioning apparatus; (iv) a gain-controllable amplifier having a signal input coupled to said first input and an output coupled to a second output for providing dynamic range restored output signals; and (v) a first circuit, the first circuit for controlling gain of the gain-controllable amplifier such that the gain-controllable amplifier has maximum gain when the electrical input signal has a predetermined maximum value and such that the gain-controllable amplifier has minimum gain when the electrical input signal has a predetermined minimum value.

15 Claims, 2 Drawing Sheets

DYNAMIC RANGE RESTORER AND METHOD

BACKGROUND OF THE INVENTION

1. Field of the Invention

This invention relates to a method, apparatus and system for providing variable gain for use with musical instruments.

More particularly, the present invention relates to suppression of noise and restoration of dynamic range for use with signal conditioners and/or amplifiers intended for use with musical instruments.

In a further and more specific aspect, the instant invention concerns a method and apparatus for restoring the dynamic range of musical sound systems that include sound-shaping devices such as distortion boxes and also for providing a noise-gating function intended for application with musical instruments.

2. Prior Art

Music is often generated on musical instruments which produce a signal, such as an electric guitar. The signals are eventually amplified to produce the music played. Musicians have a wide variety of conditioning devices at their disposal which can be positioned between the instrument and the amplifier to modify the signals generated by the instrument. The modified signal is then amplified. These conditioning devices permit musicians to greatly enhance their music and the flexibility of their instruments.

The problem with many of these conditioning devices is that they greatly reduce or eliminate the dynamic range of the musical signals. Musical scores played by a musician generally includes dynamic notations which lend depth to the music. The interplay between quietly played notes and loudly played notes often gives music much of its emotional impact. Without dynamics, music can be rather flat. Furthermore, musicians instill their unique feel and artistry to music through dynamics. Thus, the loss of dynamic range can adversely affect the appeal of the music played.

In operation of amplifiers and signal conditioners for use with musical instruments, several different types of problems are frequently encountered. These problems include reduction of dynamic range, whereby the ratio of the loudest components of the music to the weakest sounds comprising the music, is reduced below that which would obtain absent the presence of the signal conditioning equipment. These problems also include pickup of noise and pickup of externally-generated electrical or radio signals, which detract from the tonal quality of the music and also serve to further reduce dynamic range in the resultant musical renditions.

Accordingly, it is desirable, particularly with respect to signal conditioning for musical instruments, to be able to restore dynamic range without undue compromise of noise characteristics in the final signal. These goals need to be met whether the musician is using an amplifier, digital effects, distortion box, reverberation unit, graphic equalizer or any other type of signal conditioning equipment which compresses the dynamic range.

In order to combat these varied problems, some form of signal conditioning circuit is needed which primarily restores dynamic range, and which can also reduce noise levels, act as a noise gate and effectuate other signal conditioning tasks as desired by the musician or effectuated by the roady.

An additional problem encountered in many systems is known as transient intermodulation distortion. Transient intermodulation distortion typically arises when a very fast amplifier is coupled to a feedback system having a slower response time. The settling time for the composite assembly may be substantially less than that for the amplifier alone, but the feedback system may also provide signal conditioning qualities that are extremely desirable.

The effect of transient intermodulation distortion is most readily understood by imagining a cymbal crash (having amplitude at or near the peak signal amplitude that the system can accommodate) accompanying and followed immediately by very soft guitar notes. During the time interval while the amplifier and feedback loop are recovering from the effects of the cymbal crash, the soft guitar notes are muted or suppressed. This, in turn, provides an unwelcome interruption in the music and interferes with the artist's ability to expressively communicate with the audience.

It would be highly advantageous, therefore, to remedy the foregoing and other deficiencies inherent in the prior art.

Accordingly, it is an object of the present invention to provide improvements in signal conditioning equipment for musical applications.

Another object of the present invention is the provision of an improved method and apparatus for providing distortion to musical signals without suffering an attendant reduction in dynamic range of the musical signals and for additionally providing a noise gating function.

An additional object of the instant invention is the provision of an improved method and apparatus for providing reduction in both noise and unwanted distortion while also providing desired distortion.

Moreover, it is an object of the instant invention to provide an improved method and apparatus for restoring the dynamic range of musical signals in the course of providing signal conditioning functions.

Still a further additional object of the present invention is to provide an improved method, apparatus and system for reduction of weight, size and electrical power required in order to effectuate musical signal conditioning, including noise gating.

And another object of the present invention is to provide an improved method, apparatus and system for reducing dynamic range reduction effects in musical signal conditioning equipment.

Still another object of the present invention is the provision of a method, system and apparatus for suppressing electronically generated noise during quiet passages of a musical piece.

Yet still another object of the instant invention is the provision of a method, system and apparatus for suppressing dynamic range reduction effects in signal conditioning apparatus for application to musical instruments.

And a further object of the invention is to provide a method, system and apparatus for suppressing both electronically-generated noise and dynamic range reduction without undue compromise of signal quality due to transient intermodulation distortion.

Still a further object of the immediate invention is the provision of a method, apparatus and system for reducing undesirable effects in signal conditioning for musical instruments, particularly with respect to guitar music.

And still a further object of the invention is the provision of method and apparatus, according to the foregoing, which is intended to allow operation of an amplification system, together with signal conditioning such as a distortion box, reverberation unit, digital effects, graphic equalizer or any other signal conditioning apparatus, that enables and effectuates reduced electronic noise levels, increased dynamic range and that provides the desired signal conditioning.

SUMMARY OF THE INVENTION

Briefly, to achieve the desired objects of the instant invention in accordance with a first preferred embodiment thereof, provided is an apparatus for suppressing noise and restoring dynamic range to musical signals passing through signal conditioning circuitry.

The apparatus desirably includes in combination: (i) a first input for accepting electrical input signals; (ii) a first output for supplying the electrical input signals to a signal conditioning apparatus; (iii) a second input for accepting conditioned electrical input signals from the signal conditioning apparatus; (iv) a level adjuster an example of which is a gain-controllable amplifier having an output coupled to a second output for providing dynamic range restored output signals; and (v) a level controller, an example of which is a first circuit for controlling gain of the gain-controllable amplifier such that the gain-controllable amplifier has maximum gain when an input signal has a predetermined maximum value and such that the gain-controllable amplifier has minimum gain when the input signal has a predetermined minimum value.

The apparatus desirably but not essentially also includes a feature whereby the first circuit includes a circuit that provides a conversion of electronic audio signals to direct current using a rule chosen from a list consisting of: root-mean-square to direct current, peak detection and average signal level detection.

The apparatus desirably but not essentially further includes a feature wherein the first circuit includes a circuit that provides a conversion of electronic audio signals to direct current signals such that a voltage of the direct current signals is proportional to a power level of the electronic audio signals.

The apparatus desirably but not essentially additionally further includes a switch, which, when positioned in a first position, bypasses the gain-controllable amplifier, and which, when positioned in a second position, includes the gain-controllable amplifier between the first input and the second output.

The apparatus desirably but not essentially yet further includes a slope adjustment circuit coupled between the gain-controllable amplifier and the first circuit, wherein the slope adjustment circuit includes an adjustable offset provision and a gain adjustment provision, and additionally desirably provides a low pass filter coupled between the first circuit and the slope adjustment circuit, wherein the low pass filter has a cutoff frequency in the audio frequency range.

The apparatus preferably but not essentially further includes: (i) a guitar as a source for the electrical input signals; (ii) a guitar amplifier having an input coupled to the second output; and (iii) a distortion box comprising the signal conditioning apparatus.

In a second preferred embodiment, the instant invention contemplates a method for restoring dynamic range to an audio signal such as a musical signal. The method includes steps of: (i) providing the audio signal from a signal source; (ii) providing a direct current voltage that is related to a level of the audio signal; (iii) providing the audio signal to a first input of a variable-gain amplifier; (iv) providing the direct current voltage to a gain control input of the variable-gain amplifier; and (v) providing an output signal from the variable-gain amplifier to an external apparatus.

The method of the second preferred embodiment desirably but not essentially also includes a features whereby the step of providing the audio signal from a signal source includes a step of providing the audio signal from an electric guitar and whereby the step of providing an output signal from the variable-gain amplifier to an external apparatus includes a step of providing an output signal to a guitar amplifier.

The method of the second preferred embodiment desirably but not essentially further also includes a feature whereby the step of providing a direct current voltage that is related to a level of the audio signal comprises a step of providing a direct current voltage that is proportional to a root-mean-square value of the audio signal and further desirably but not essentially comprises a step of low pass filtering the direct current voltage, wherein a cutoff frequency of the low pass filtering step is in an audio range, i.e., between 100 Hz and 15 kHz.

The method of the second preferred embodiment desirably but not essentially further additionally includes a feature comprising a step of coupling a distortion box between the guitar and the first input of the variable-gain amplifier, in order to increase the charisma associated with the musical signals being conditioned by the method.

In a third preferred embodiment, the instant invention contemplates a sound system for conditioning of musical signals. The sound system includes in combination: (i) an electric guitar for providing the musical signals as electrical input signals; (ii) a first input for accepting the electrical input signals; (iii) a first output for supplying the electrical input signals to a signal conditioning apparatus; (iv) a second input for accepting conditioned electrical input signals from the signal conditioning apparatus; (v) a gain-controllable amplifier having an output coupled to a second output for providing dynamic range restored output signals; (vi) a first circuit, the first circuit for controlling gain of the gain-controllable amplifier such that the gain-controllable amplifier has maximum gain when an input signal has a predetermined maximum value and such that the gain-controllable amplifier has minimum gain when an input signal has a predetermined minimum value; and (vi) a guitar amplifier having an input coupled to the second output for providing dynamic range restored output signals.

The third preferred embodiment desirably but not essentially includes provisions whereby: (i) the first circuit includes a circuit that provides a conversion of electronic audio signals to direct current signals such that a voltage of the direct current signals is proportional to a power level of the electronic audio signals and (ii) a switch, which, when positioned in a first position, bypasses the gain-controllable amplifier, and which, when positioned in a second position, includes the gain-controllable amplifier between the first input and the second output for providing dynamic range restored output signals.

The third preferred embodiment desirably but not essentially additionally includes provisions whereby: (i) a slope adjustment circuit coupled between the gain-controllable amplifier and the first circuit, wherein the slope adjustment circuit includes an adjustable offset provision and a gain adjustment provision; (ii) a low pass filter is coupled between the first circuit and the slope adjustment circuit, the low pass filter having a cutoff frequency in the audio range; and (iii) a distortion box comprises the signal conditioning apparatus.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENT

Figure 1:
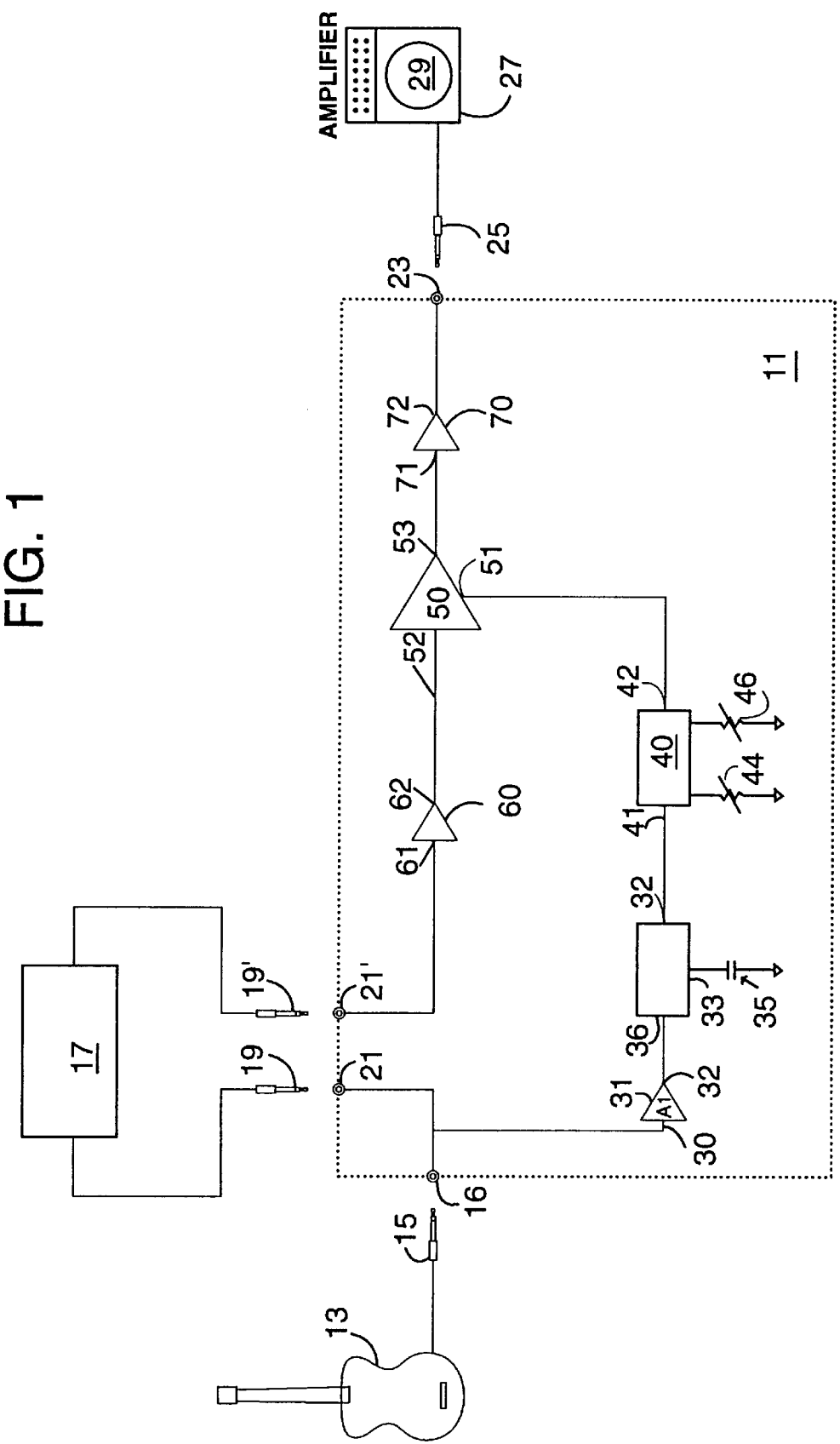
FIG. 1 is a simplified, block schematic illustration of a first preferred embodiment of a signal conditioning apparatus including a dynamic range restorer, in accordance with the teachings of the instant invention.

Turning now to the drawings, in which like reference characters indicate corresponding elements throughout the several views, attention is first directed to FIG. 1, which illustrates a simplified, block diagram schematic view of a first preferred embodiment of a signal conditioning apparatus for dynamic range restoration and noise gating, which is generally designated by the reference character 11, and is broadly intended for use with a guitar 13, for example, in accordance with the teachings of the instant invention.

Dynamic range restorer 11 is intended to be used in conjunction with a musical instrument such as a guitar 13 that provides an electrical signal via, for example, a connector 15 to an input 16. Dynamic range restorer 11 may be coupled to, for example, a distortion box 17 via connectors 19, 19' that couple to jacks 21, 21' disposed on dynamic range restorer 11. Dynamic range restorer 11 provides an output signal via connector 23 adapted to mate to a connector 25, that, in turn, usefully couples to a guitar amplifier 27 having an audio output device 29 such as a loudspeaker.

While connectors 15, 16, 19, 19', 21, 21', 23 and 25 are illustrated for ease of explanation and communication as being ¼" phone jacks and plugs, it will be appreciated that other types of connectors may be employed for this purpose, and that the type of signal conditioning equipment employed (e.g., distortion box 17, in this example) may vary from one case to another without affecting the utility of dynamic range restorer 11. Similarly, amplifier 27 could be replaced by other types of signal processing equipment (e.g., a recording device, transmitter or public address system) without compromising the utility and applicability of dynamic range restorer 11.

Apparatus such as distortion box 17 typically operate by including a pair of diodes coupled between the two signal lines such that one or the other diode is forward biased for the larger signal excursions, thus clipping the peaks of the positive and negative swings of the signal. This process generates harmonics of the input signal frequencies, and these harmonics add character and flavor to the signals that have been conditioned by distortion box 17.

However, because all of the signals that have been processed via distortion box 17 are clipped to the same peak amplitude (about 0.7 volts when silicon diodes are used and about 0.3 volts when germanium diodes are employed), the dynamic range of signals that have been processed by distortion box 17 is greatly compressed. Efforts to compensate for this dynamic range compression by adding gain alone also tend to result in significant noise, which is particularly apparent (as a hissing noise which is generally undesirable) when the artist is attempting to convey mood via the medium of a quiet passage.

These deleterious effects are generally ameliorated when dynamic range restorer 11 is employed together with signal conditioning apparatus such as distortion box 17, allowing the artist to provide the warmth of expression made possible by distortion box 17 without the hiss of electrical noise pervading during quiet passages and without significant compromise of the dynamic range of the instrument(s).

For the case where one or more of the instruments is a guitar 13, this dynamic range is typically on the order of 80 dB; when a typical 16 bit CD is used as a recording medium with ½ of a least significant bit as the lowest amplitude, a dynamic range of $20 \log(2^{16})$ of about 96 dB is obtained. It is desirable that the dynamic range of the composite system comprising the ensemble of dynamic range restorer 11, distortion box 17, instrument(s) 13 and any other ancillary gear equal or exceed the dynamic range of the system to which it is coupled.

In operation, the signals from guitar 13 (or any other source) are coupled via connectors 15, 16 to both input 30 of an amplifier 31 and via connectors 19, 21 to the input of distortion box 17. The output of distortion box 17 is in turn coupled via connectors 19', 21' to an input 61 of a first amplifier 60.

The first amplifier 60 amplifies the distorted signals from distortion box 17 and these signals are supplied at an output 62 of first amplifier 60. Output 62 of first amplifier 60 is coupled to an input 52 of a level adjuster, which in this embodiment is an automatic gain controlled (AGC) amplifier 50, which has a second input 51 for supplying a signal to vary the gain of the AGC amplifier 50. Output 53 of AGC amplifier 50 is coupled to an input 71 of a second amplifier 70. An output 72 of the second amplifier 70 is coupled via connectors 23, 25 to external apparatus such as amplifier 27.

The signal supplied to variable gain input 51 of AGC amplifier 50 is generated by amplifying the input signal from connector 16 via amplifier 31 and the output signal from this amplifier 31 is present at output 32. This output 32 is coupled to an input 36 of a level controller, which in this embodiment is an RMS/DC converter 33. The RMS/DC converter 33 produces a direct current output signal having an amplitude or voltage that is directly proportional to the amplitude of the input signal from connector 16. In effect, by obtaining a power level of the input signal, a volume envelope is established for the raw signal generated by the musician on guitar 13. The time constant for this conversion process is set by, among other things, the magnitude of a capacitor 35.

This time constant significantly affects the transient intermodulation distortion characteristics of dynamic range restorer 11, particularly when it is used as a noise gate. Typically, capacitor 35 is chosen to have a value that allows the output signal to track to within 1% of the nominal value within 80 milliseconds or less of a loud signal having an amplitude near the upper end of the dynamic range of the overall system.

When dynamic range restorer 11 is used in conjunction with signals from guitar 13 having small amplitudes, the reduced voltage fed to gain control input 51 of gain controlled amplifier 50 provides reduced gain from gain controlled amplifier 50 and hence electronic noise from the overall sound system is reduced. However, the action of dynamic range restorer 11 acting as a noise gate differs from that of the conventional noise gates in that conventional noise gates are either "on" or "off" and do not provide a graceful transition from one state to the other as does dynamic range restorer 11.

The output signal at output 37 from RMS/DC converter 33 is coupled to an input 41 of a slope adjustment circuit 40. Slope adjustment circuit 40 amplifies the DC signal from RMS/DC converter 33 to match the signal levels to those appropriate for AGC amplifier 50 gain control input 51. The gain of slope adjust circuit 40 is adjusted via a potentiometer 44 and the offset is determined by adjustment of another potentiometer 46. The output signal from output 42 of slope adjustment circuit 40 is coupled to variable gain input 51 of AGC amplifier 50.

By determining the power level of the incoming raw guitar signals, the output from a conditioning device such as distortion box 17 can be proportionately adjusted. Thus, the amplitude of the output from distortion box 17 is modified to vary with the signal levels played by the musician and dynamic range is restored.

EXAMPLE

Figure 2:
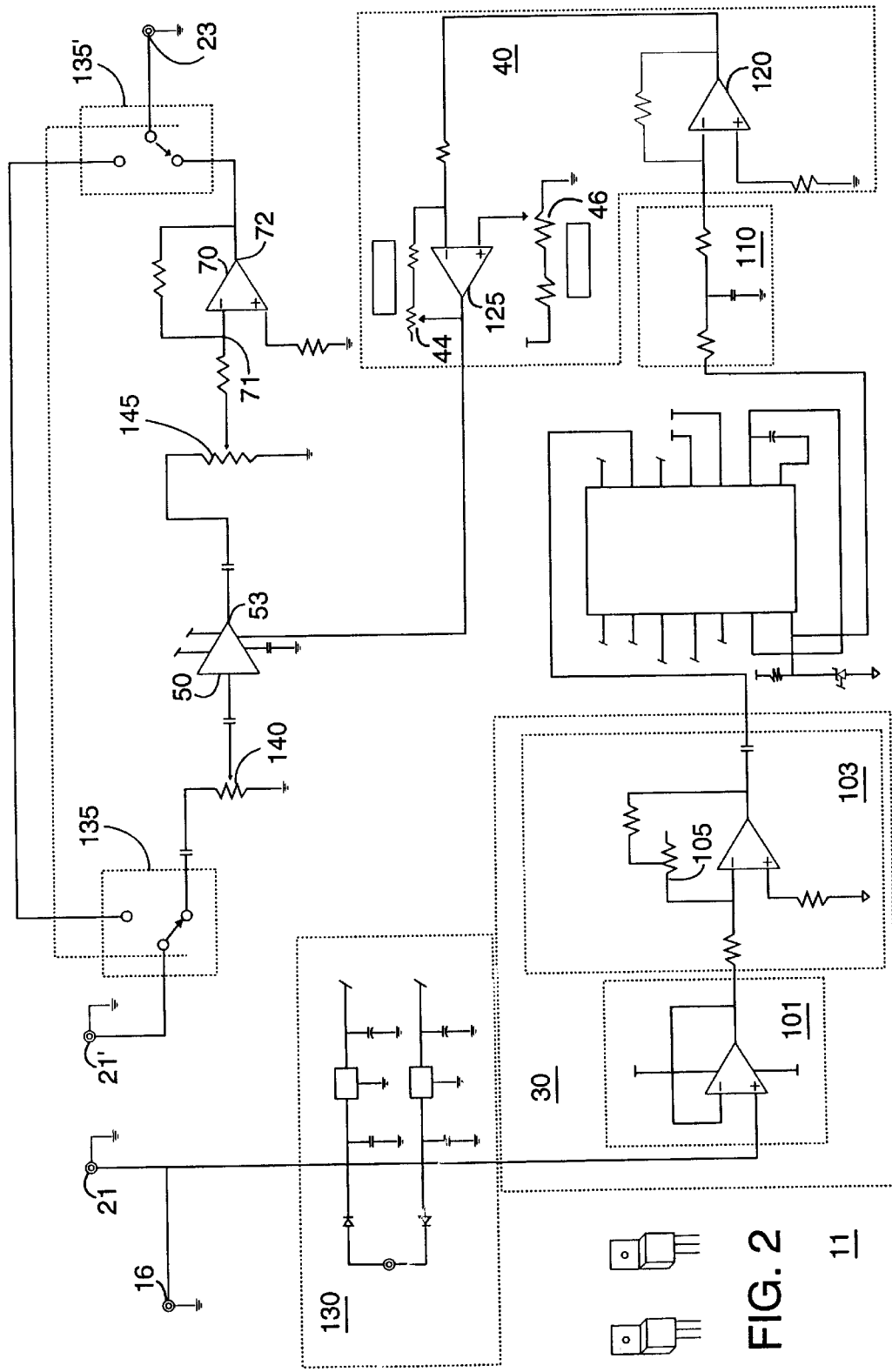
FIG. 2 is a simplified schematic diagram of a first preferred embodiment of the dynamic range restorer of FIG. 1, in accordance with the teachings of the instant invention.

Directing attention now to FIG. 2, a simplified schematic view of a first preferred embodiment of the dynamic range restorer 11 is shown, in accordance with the teachings of the instant invention. This prototype example was designed to meet or exceed the specifications provided below in Table I.

TABLE I

Specifications for prototype example of the dynamic range restorer.

| Input impedance: | 470 kΩ |
|---|---|
| Output impedance: | 300 Ω |
| Maximum input signal level: | 0 dBv |
| Maximum output signal level: | 0 dBv |
| Residual output noise (135 Hz to 25 kHz): | < −85 dBv |
| Input dynamic range: | > 108 dB |
| Power requirements: | 12 VAC @ 400 mA |

These specifications are met using an MC3340 amplifier, available from Motorola of Phoenix Ariz., as gain controlled amplifier 50 (an Analog Devices AD600 amplifier may be used instead), and either an AD636 (preferred) or an AD 737 amplifier chip from Analog Devices for the remainder of the amplification functions. The characteristics of guitar 13 (FIG. 1) assumed in the design of exemplary circuit 11 of FIG. 2 are summarized below in Table II.

TABLE II

Guitar specifications for use with the dynamic range restorer.

| Neck coil output power: | 320 mW |
|---|---|
| Neck coil DC resistance: | 17.53 kΩ |
| Bridge coil output power: | 425 mW |
| Bridge coil DC resistance: | 13.68 kΩ |

System 11 of FIG. 2 includes two amplification circuits 101, 103 as first amplifier 30 of FIG. 1. Voltage follower 101 buffers the guitar output signal and provides a lower impedance signal. As shown, this amplifier provides unity gain and comprises one-fourth of a TL704 operational amplifier.

The second portion of first amplifier 30 of FIG. 1 comprises gain block 103, which provides a higher amplitude signal to gain-controlled amplifier 50 of FIGS. 1 and 2. Gain block 103 has provision for gain adjustment via a potentiometer 105, which is adjusted to provide roughly 20 volts peak-to-peak at the output (corresponding to output 32 of FIG. 1) when maximum input signal amplitude is provided at input 16, e.g., by playing a guitar as loudly as possible.

Controlled gain amplifier 50 is conveniently realized as an MC3340P amplifier. Signal levels to and from controlled gain amplifier 50 are adjusted as described below.

RMS/DC converter 33 is shown as being realized as an AD637 or AD636 amplifier from Analog Devices and is followed by a low pass filter 110 having a cutoff frequency in the audio range, for example, at about 1 kHz. Low pass filter 110 removes very high frequency noise (ca. 800 kHz) known to be present at times at the output of the RMS/DC converter. RMS/DC converter 33 is preferably set up to provide an output voltage that is proportional to the root-mean-square (RMS) value of the input signal amplitude, because this is also proportional to the power level of the input signal. Other options for RMS/DC converter 33 include operation as a peak detector or as an average signal level detector.

RMS/DC converter 33 can accept input signal levels from 0 to 200 millivolts and convert this to a DC signal having an amplitude of 0 to 200 millivolts, which is integrated over about ten cycles of the lowest signal frequency expected (E below middle C or ca. 135 Hz), about 74 milliseconds, and this integration time is selected using a capacitor (e.g., capacitor 35, FIG. 1) external to chip 33 itself.

Slope adjust circuit 40 is realized as two components, a first of which is a slope inverting amplifier 120 and a second of which is a slope adjustment circuit 125 having potentiometers 44 and 46 coupled thereto. An optional power supply circuit 130 converts AC to regulated DC utilizing conventional components readily available to those of skill in the relevant arts.

Switches 135, 135' desirably comprise a single double pole, double throw (DPDT) switch for bypassing dynamic range restorer 11 without having to physically remove it from the signal path. A potentiometer 140 allows the signal level that is input to variable gain amplifier 50 to be adjusted to provide about 1.4 volts peak-to-peak when the maximum output signal (about 2.8 volts peak-to-peak) from distortion box 17 is realized.

A potentiometer 145 allows the signal level of dynamic range restorer 11 to be comparable to the signal level that would be present without dynamic range restorer 11, by comparing signal levels as switches 135, 135' are opened and closed and adjusting potentiometer 145 to realize 2.5 volts peak-to-peak when potentiometer 46 is set to a threshold of about 2.5 volts as measured at pin 2 of variable gain amplifier 50.

It will be appreciated that a system for suppressing electronically generated noise and increasing dynamic range has been described that is readily and easily employed in conjunction with the operation of musical instruments such as a guitar. The system may be included as an integral part of an amplification system and/or distortion box or may be deployed in modular form to provide a reconfigurable musical sound system.

It will be appreciated that need for a portable signal conditioning device has been described along with methods and apparatus for meeting that need. A novel variable gain amplifier circuit has been described that finds application in suppressing undesirable effects in amplification and signal conditioning for musical circuits. It will be appreciated by those of skill in the relevant arts that additional variable gain amplifiers may be cascaded to increase overall system dynamic range. Furthermore, it will be understood that various other circuit configuration can be employed, and may be analog, digital, discrete components or integrated circuits. It is also contemplated that the invention can be performed via a computer which digitizes and analyzes an incoming signal, determine level of signal and controls a variable gain amplifier to modify a conditioned signal proportionally to the musician generated signal.

Various changes and modifications to the embodiment herein chosen for purposes of illustration will readily occur to those skilled in the art. For example, different power supply arrangements, different operational amplifier circuits and the like may be chosen as may be desired for a specific application. Obtaining the power level of the raw guitar signal and generating a control signal (level controller) can be accomplished in numerous ways. The reason a RMS to DC converter is used in the preferred embodiment is because it provides a logarithmic DC output which is compatible with the AGC amp selected and because the RMS is a true measure of the power in a signal. This is believed to be what the ear "hears" when it gauges volume. Instead of RMS, it's possible to employ, for example, a simple circuit which averages a signal level over some time interval. As further examples, a peak detector, sample and hold, simple rectifier, and sample an A/D can all be employed. A simple peak detector tracks the signal peaks (rather than RMS or average) usually over some time interval (i.e., the time constant of the peak detector). This could also be used to gauge signal level and as an AGC control. A sample and hold is an analog circuit which samples the signal (usually at a periodic interval) and maintains the sampled value until the next sample. An output of this type could be used as an AGC control. A simple rectifier is conceptually similar to an averaging circuit in that it converts an AC (music) signal to some DC level. A sample A/D is conceptually identical to a sample and hold, but instead of "storing" the sample on an analog capacitor, the sample is stored in software memory. However, if sampled very quickly (nyquist rate), software can do math to derive the RMS, average, peak, or any other desired parameter. This result could then be used as AGC control.

Furthermore, changing the level of the distorted or conditioned output (level adjuster) can be accomplished in many ways, examples of which are discussed below. A voltage variable amplifier (VVA) can be used to change the level of the distorted output. A corollary to a VVA is a current variable amplifier. Another corollary would be any circuit whose parametric change was used to change the level of the distorted output. Any type of variable attenuator can be used. Instead of providing variable gain to change the level of the distorted output (as an AGC chip circuit does) you could also just vary the attenuation (and then provide fixed gain later if needed to condition the signal to the desired level). In a digital or DSP approach, the sampled A/D math result could be used to provide signal gain (or attenuation) to a D/A to reproduce the output at a changed level.

To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. An apparatus for restoration of dynamic range to electronically amplified acoustic signals, said apparatus comprising:

a first input for accepting electrical input signals having a dynamic range;

a first output for supplying said electrical input signals to a signal conditioning apparatus which reduces the dynamic range of the electrical input signals;

a second input for accepting conditioned electrical input signals from said signal conditioning apparatus;

a level adjuster coupled to the second input for providing dynamic range restored output signals; and a level controller directly connected between the first input and the level adjuster for determining the dynamic range of the electrical input signals and controlling the level adjuster to restore the dynamic range to the conditioned electrical input signal.

2. An apparatus as claimed in claim 1, wherein the level adjuster includes a gain-controllable amplifier.

3. An apparatus as claimed in claim 2 wherein the level controller includes a first circuit, said first circuit for controlling gain of said gain-controllable amplifier such that said gain-controllable amplifier has maximum gain when said electrical input signal has a predetermined maximum value and such that said gain-controllable amplifier has minimum gain when said electrical input signal has a predetermined minimum value.

4. An apparatus as claimed in claim 3, wherein said first circuit includes a circuit that provides a conversion of electronic audio signals to direct current using a rule chosen from a list consisting of: root-mean-square to direct current, peak detection and average signal level detection.

5. An apparatus as claimed in claim 3, wherein said first circuit includes a circuit that provides a conversion of electronic audio signals to direct current signals such that a voltage of said direct current signals is proportional to a power level of said electronic audio signals.

6. An apparatus as claimed in claim 3, further comprising a slope adjustment circuit coupled between said gain-controllable amplifier and said first circuit, wherein said slope adjustment circuit includes an adjustable offset provision and a gain adjustment provision.

7. An apparatus as claimed in claim 6, wherein a low pass filter is coupled between said first circuit and said slope adjustment circuit, said low pass filter having a cutoff frequency in the audio range.

8. An apparatus as claimed in claim 1, wherein said apparatus further includes a switch, which, when positioned in a first position, bypasses said level adjuster, and which, when positioned in a second position, includes said level adjuster between said first input and said second output.

9. An apparatus as claimed in claim 1, further including a guitar as a source for said electrical input signals.

10. A sound system for conditioning musical signals, said system comprising:

an electric guitar for providing said musical signals as electrical input signals;

a first input for accepting electrical input signals having a dynamic range;

a first output for supplying said electrical input signals to a signal conditioning apparatus which reduces the dynamic range of the electrical input signals;

a second input for accepting conditioned electrical input signals from said signal conditioning apparatus;

a level adjuster coupled to the second input for providing dynamic range restored output signals;

a level controller directly connected between the first input and the level adjuster for determining the dynamic range of the electrical input signals and controlling the level adjuster to restore the dynamic range to the conditioned electrical input signal; and a guitar amplifier coupled to said second output.

11. A sound system as claimed in claim 10, wherein the level adjuster includes a gain-controllable amplifier.

12. A sound system as claimed in claim 11 wherein the level controller includes a first circuit, said first circuit for controlling gain of said gain-controllable amplifier such that said gain-controllable amplifier has maximum gain when said electrical input signal has a predetermined maximum value and such that said gain-controllable amplifier has minimum gain when said electrical input signal has a predetermined minimum value.

13. An apparatus as claimed in claim 12, wherein said first circuit includes a circuit that provides a conversion of electronic audio signals to direct current signals such that a voltage of said direct current signals is proportional to a power level of said electronic audio signals.

14. An sound system as claimed in claim 10, wherein said sound system further includes a switch, which, when positioned in a first position, bypasses said level adjuster, and which, when positioned in a second position, includes said level adjuster between said first input and said second output.

15. An apparatus as claimed in claim 12, further comprising a slope adjustment circuit coupled between said gain-controllable amplifier and said first circuit, wherein said slope adjustment circuit includes an adjustable offset provision and a gain adjustment provision.

* * * * *